United States Patent [19]

Hayashi

[11] Patent Number: 5,015,866
[45] Date of Patent: May 14, 1991

[54] STAGE APPARATUS IN EXPOSING APPARATUS

[75] Inventor: Yutaka Hayashi, Yokohama, Japan

[73] Assignee: Nikon Corporation, Tokyo, Japan

[21] Appl. No.: 444,330

[22] Filed: Dec. 1, 1989

[30] Foreign Application Priority Data

Dec. 5, 1988 [JP] Japan .................. 63-307437

[51] Int. Cl.⁵ .................................. G01N 21/86
[52] U.S. Cl. .............................. 250/548; 250/557
[58] Field of Search ............. 250/548, 557; 356/399, 356/400, 401

[56] References Cited

U.S. PATENT DOCUMENTS

| | | | |
|---|---|---|---|
| 4,558,949 | 12/1985 | Uehara et al. | 356/400 |
| 4,650,983 | 3/1987 | Suwa | 250/204 |
| 4,770,531 | 9/1988 | Tanaka et al. | 356/401 |
| 4,780,617 | 10/1988 | Umatate et al. | 250/548 |
| 4,870,452 | 9/1989 | Tanimoto et al. | 356/400 |
| 4,874,954 | 10/1989 | Takahashi et al. | 250/548 |
| 4,880,310 | 11/1989 | Nishi | 356/401 |
| 4,902,900 | 2/1990 | Kamiya et al. | 250/548 |

FOREIGN PATENT DOCUMENTS 62-150721 12/1985 Japan .

Primary Examiner—David C. Nelms
Attorney, Agent, or Firm—Shapiro and Shapiro

[57] ABSTRACT

In an exposing apparatus for copy transferring a pattern formed on a mask onto a substrate, the substrate is supported on a leveling stage mounted on a two-dimensionally movable stage. Two-dimensional deviation amounts of the substrate in relation to the moving stage, caused by inclination of the leveling stage, are detected and are compensated by controlling the movement of the moving stage, thereby correcting the relative positional relation between the mask and the substrate.

15 Claims, 2 Drawing Sheets

STAGE APPARATUS IN EXPOSING APPARATUS

BACKGROUND OF THE INVENTION

1. Field of the Invention

The present invention relates to an exposing apparatus which is used in the lithography process in manufacturing of a semiconductor integrated circuit and, more particularly, to a stage apparatus having a leveling function for inclining a photo sensitive substrate and making a predetermined exposure reference surface, for instance, a projection image plane of a mask pattern projected by a projection optical system accurately coincide with the surface of the photo sensitive substrate.

2. Related Background Art

In the lithography process, a reduction projection type exposing apparatus of the step and repeat system, what is called, a stepper, plays a central role. In a stepper, it is necessary to raise the resolution limit of the projection lens in correspondence to a line width of a pattern of a semiconductor device which is formed on the submicron order. The need for a projection lens which has both a large numerical aperture (N.A.) and a wide exposure field has increased substantially in recent years. However, a focal depth of the projection lens of a large N.A. and a wide exposure field is inevitably shallow. Therefore, even when a predetermined exposure reference surface accurately coincides with the surface of an arbitrary shot area on the wafer at the shot center (focus matching), if the surface of a part of the shot area is inclined from a predetermined exposure reference surface such as a projection image plane of the mask pattern, it is difficult to always execute accurate focus matching in the whole surface in the exposure field. Regarding this problem, a stepper having a leveling mechanism comprising an inclination detecting system (horizontal position detecting system) is disclosed in U.S. Pat. No. 4,558,949 and a stage apparatus (wafer stage) is disclosed in U.S. Pat. No. 4,770,531, wherein an inclination of the shot area from a predetermined exposure reference surface is detected by using the horizontal position detecting system. In such a stepper, a predetermined plurality of points (for instance, three operating points) are driven to incline a leveling stage forming part of the wafer stage and an angle of inclination of the leveling stage is controlled, thereby making the surface of the shot area accurately coincide with the exposure reference surface. In the initial adjustment of the stepper, a predetermined neutral state exists (for example, a state in which each operating point is located at the center of a movement stroke in the Z direction along the optical axis of the projection lens). Adjustment is executed in a manner such that a virtual rotation center point of the leveling stage serving as an apparent reference point of the inclining operation is located in the exposure reference surface, which includes the length measuring axis (center of the laser light flux) of a laser interferometer used to detect stage positions. The exposure reference surface coincides with the surface of a reference wafer which is mounted on the leveling stage and with the projection image plane (image forming surface) of the mask pattern projected by the projection lens. By making the surface of the shot area accurately coincide with the exposure reference surface for every shot, using the leveling mechanism, a circuit pattern of a mask or a reticle (hereinafter, simply referred to as a "reticle") is exposed on the wafer at high resolution and without focal deviation in the exposure field.

However, in the stepper having such a leveling mechanism, it is difficult to ensure that the virtual rotation center point of the leveling stage is accurately located in a surface such as an exposure reference surface or the like in the initial adjustment, from the viewpoint of accuracy in manufacturing of the leveling stage or the like. There is also a problem in that it takes a long time for such adjustment. Further, in the case of performing leveling by inclining the leveling stage by an angle $\theta$ in a state in which a deviation in the Z direction remains between the rotation center point and the exposure reference surface (that is, the wafer surface), a lateral deviation, what is called a sine error $\Delta Se$ ($\Delta Se = v \cdot \sin\theta$) due to a deviation amount $\theta$ in the Z direction occurs. Thus, the positioning accuracy (about 0.03 $\mu$m) which is required for the wafer stage of such a stepper cannot be satisfied. On the other hand, there is also a problem in that in order to correct the lateral deviation amount, after leveling is executed for every shot, the fine alignment between the projection image of the reticle pattern and the circuit pattern on the wafer must be again executed, so that throughput deteriorates.

SUMMARY OF THE INVENTION

It is, therefore, an object of the invention to provide leveling apparatus in which lateral deviation of the wafer due to the inclination of a leveling stage can be easily corrected at high speed and the exposure can be executed at high accuracy without deteriorating throughput or the like.

Another object of the invention is to provide a stage apparatus having the above leveling apparatus.

According to the present invention, there is provided an exposing apparatus having a horizontal position detecting system [inclination detecting system] to detect the inclination of a wafer from an image forming surface [exposure reference surface] of a projection lens, in which the surface of the wafer is made to coincide with the image forming surface in accordance with a detection signal of the horizontal position detecting system, wherein the exposing apparatus is characterized by comprising: an X - Y stage for mounting the wafer thereon and two-dimensionally moving the wafer in the image forming surface; position detecting means such as a laser interferometer to respectively detect the positions in the X and Y directions of the X - Y stage; a leveling stage which is mounted over the X - Y stage and can incline the wafer in an arbitrary direction with respect to the image forming surface of the projection lens; deviation detecting means such as a laser interferometer to respectively detect lateral deviation amounts $\Delta X$ and $\Delta Y$ in the X and Y directions of the wafer from the X - Y stage which are caused due to the inclination of the leveling stage; and a main controller for controlling through an actuator unit the positions in the X and Y directions of the X - Y stage which are detected by the position detecting means on the basis of the lateral deviation amounts $\Delta X$ and $\Delta Y$ which are detected by the deviation detecting means and for correcting the lateral deviation amounts $\Delta X$ and $\Delta Y$ of the wafer.

According to the exposing apparatus of the present invention constructed as mentioned above, by providing the deviation detecting means for detecting the two-dimensional lateral deviation amount of the wafer with respect to the wafer stage and by controlling the two-dimensional positions of the wafer stage or reticle stage on the basis of the lateral deviation amounts detected by the deviation detecting means, the lateral deviation of the wafer in association with the inclination of the leveling stage is corrected, that is, the relative positional relation between the reticle and the wafer is corrected. Therefore, the lateral deviation of the wafer can be easily corrected at high speed without deteriorating the positioning accuracy of the wafer stage, throughput, and the like. The reticle pattern and the circuit pattern on the wafer can be overlaid and exposed at high accuracy.

According to the invention, by providing the deviation detecting means for detecting the movement amount (lateral deviation amount) of the photo sensitive substrate for the wafer stage including the X - Y stage and the leveling stage which can two-dimensionally move in the exposure reference surface, the position of the X - Y stage or reticle stage is controlled in accordance with the lateral deviation amount, thereby correcting the lateral deviation of the photo sensitive substrate in association with the inclination of the leveling stage. Therefore, there is no need to finely adjust the leveling stage, the time which is required for the initial adjustment of the exposing apparatus can be reduced, and the lateral deviation can be easily corrected at high speed without executing fine alignment and the like after the leveling. Also, the exposure operating speed of the exposing apparatus can be made even higher by using a sequence that corrects the lateral deviation only in the case where the lateral deviation amount which is detected by the deviation detecting means exceeds a predetermined value. Further, there is provided means for determining the lateral deviation amount, cosine error, and the like of the photo sensitive substrate due to fluctuation in thickness of the photo sensitive substrate or the like and the lateral deviation is corrected by making the determining means and the deviation detecting means cooperative, so that the lateral deviation of the photo sensitive substrate can be more accurately corrected. The deviation which is detected by the deviation detecting means is not limited to only the lateral deviation in association with the inclination of the leveling stage. For instance, the lateral deviation amount of the photo sensitive substrate (or the leveling stage) due to acceleration or the like when stepping the wafer stage can be detected and such a lateral deviation can be also easily corrected. Further, as a fixed mirror for the deviation detecting means, the back surface of a plane mirror for the laser interferometer to detect the position of the wafer stage is used. With such a construction, a positioning error of the wafer stage which occurs by a positional deviation due to the fine movement of the plane mirror in association with the stepping of the wafer stage can be also easily corrected. Thus, it is possible to realize an exposing apparatus having leveling apparatus in which the lateral deviation of the photo sensitive substrate for the wafer stage can be easily corrected at high speed and the exposure can be executed at high accuracy without deteriorating throughput or the like.

The above and other objects, features, and advantages of the present invention will become apparent from the following detailed description and the appended claims with reference to the accompanying drawings.

DETAILED DESCRIPTION OF THE PREFERRED EMBODIMENTS

Figure 1:
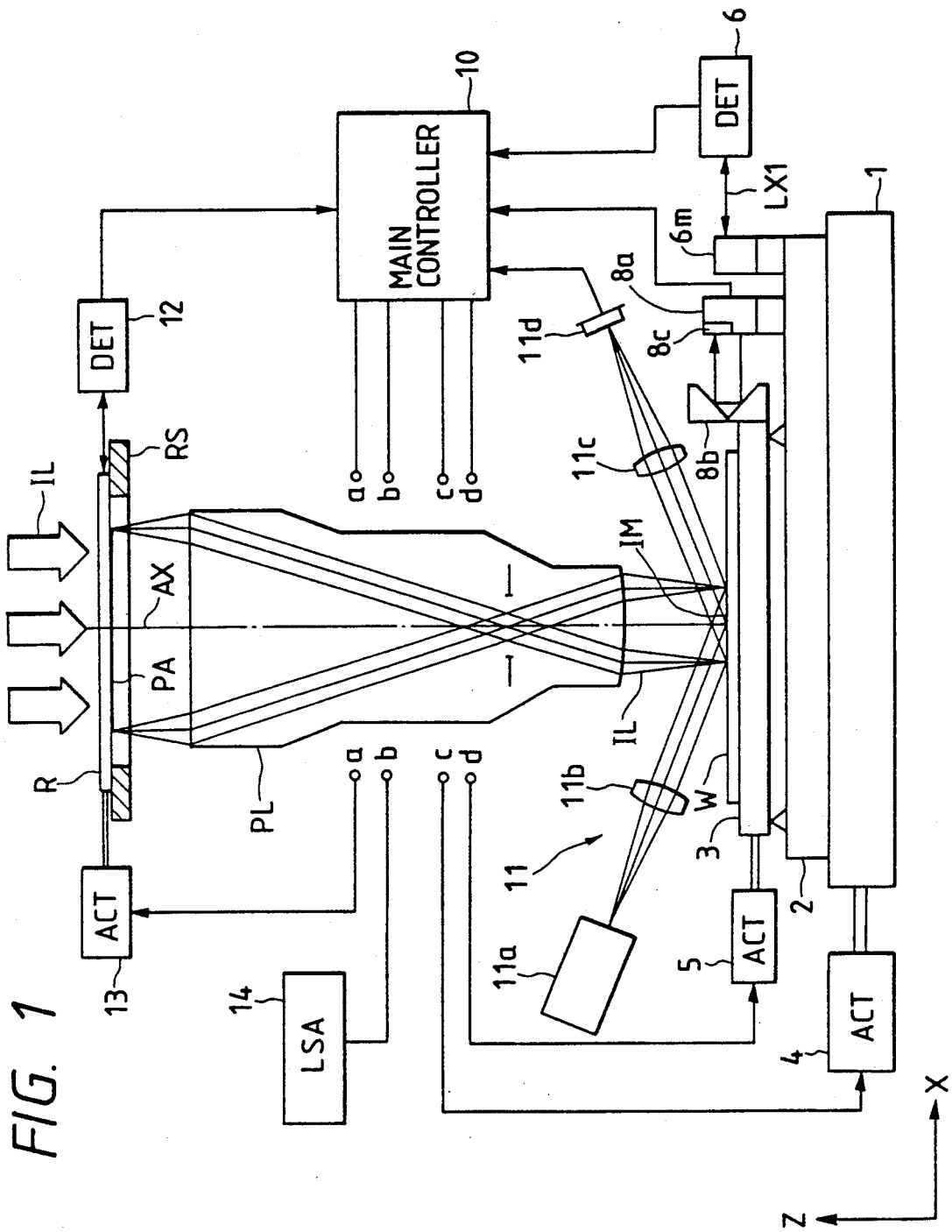
FIG. 1 is a side elevational view showing a schematic construction of an exposing apparatus of an embodiment according to the present invention.
Figure 2:
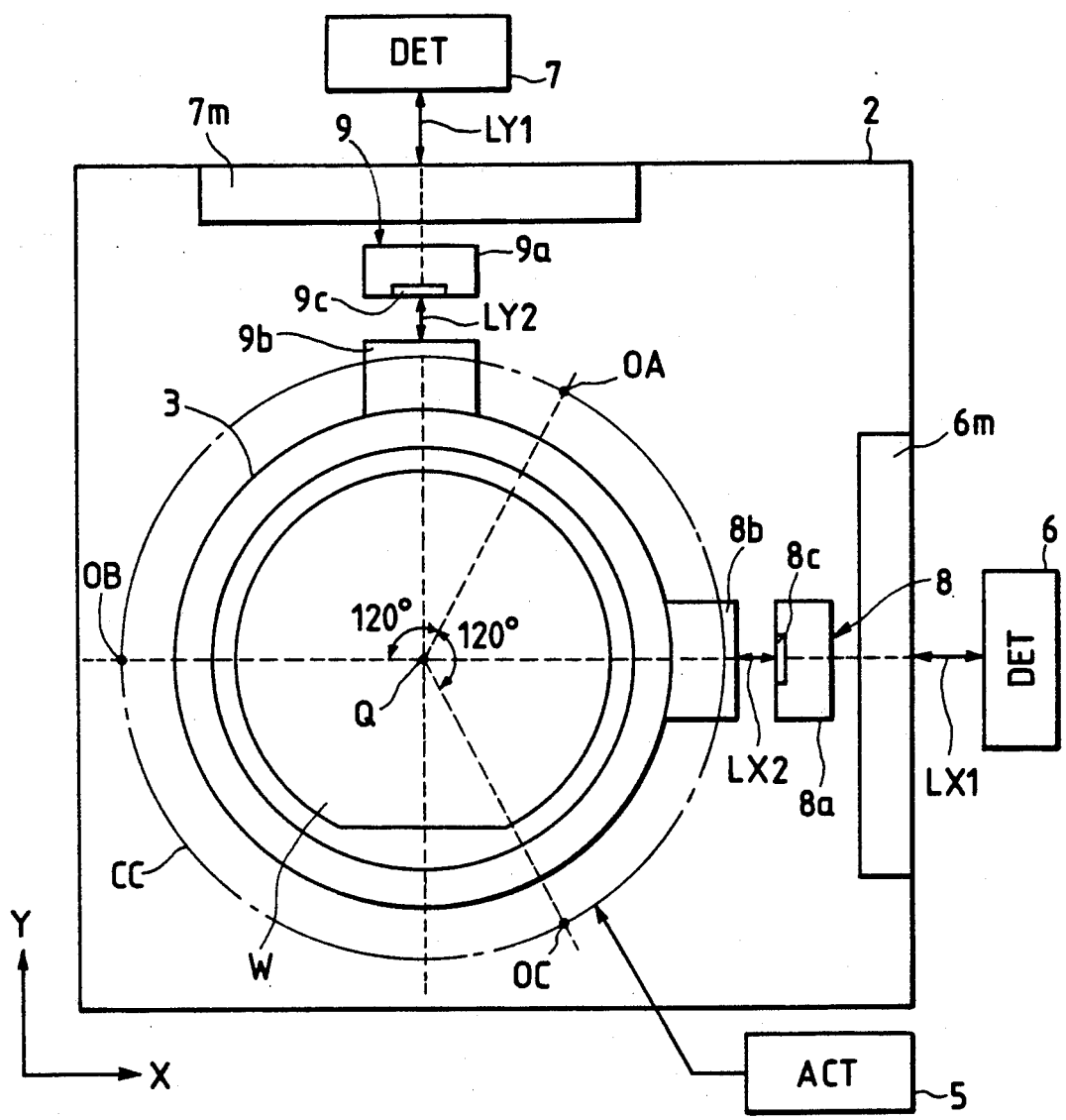
FIG. 2 is a plan view showing a schematic construction of a wafer stage forming a main section of the embodiment according to the invention, as seen from the side of a projection lens in FIG. 1.

In FIGS. 1 and 2, illumination light IL of a wavelength (exposure wavelength) such as to make a resist layer photosensitive, such as g line, i line, ultraviolet ray pulse light, or the like, which is generated from an illumination light source (not shown) such as an ultrahigh pressure mercury lamp, excimer laser light source, or the like, illuminates a pattern area PA of a reticle R at a uniform illuminance. The reticle R is vacuum adsorbed onto a reticle stage RS. An actuator unit 13 finely moves the reticle stage RS in the X and Y directions horizontally, thereby positioning the reticle R in the X and Y directions. The positions in the X and Y directions of the reticle stage RS are detected by a detector 12 comprising a laser light wave interference length measuring instrument.

The illumination light IL passed through the pattern area PA of the reticle R enters a projection lens PL whose both sides (or one side) are telecentric. The projection lens PL forms a projection image of a circuit pattern provided in the pattern area PA on a predetermined exposure reference surface, that is, on an image forming surface IM. A wafer W to be exposed is held through a rotatable wafer holder ($\theta$ table) (not shown) onto a leveling stage 3 which can be inclined in an arbitrary direction relative to the image forming surface IM. The leveling stage 3 is mounted over a Z stage 2. Further, the Z stage 2 is mounted on an X - Y stage 1 which is moved in the X and Y directions along the image forming surface IM by an actuator unit 4 for the X - Y stage. The positions in the X and Y directions of the X - Y stage 1 are detected by detectors 6 and 7 comprising laser interferometers as shown in FIG. 2 in a manner similar to the reticle stage RS. Plane mirrors 6m and 7m for the detectors 6 and 7 are arranged in the edge portions of the Z stage 2 so as to extend in the Y and X directions, respectively.

Since the construction and the like of the leveling stage 3 have been disclosed in, for instance, U.S. Pat. No. 4,770,531 mentioned above, detailed description of the construction is omitted here. The leveling stage 3 is supported over the Z stage 2 through spring members (not shown) which can be elastically deformed in the Z direction and which have high rigidities with respect to the X and Y directions. The leveling stage 3 can be inclined in an arbitrary direction with respect to the image forming surface IM by independently driving three operating points of the leveling stage 3, namely, deformation center points of the spring members in the Z direction.

Deformation center points OA, OB, and OC of the three spring members are shown in FIG. 2. The deformation center points OA, OB, and OC are arranged at an angle interval of about 120° with respect to the center of the wafer put on the leveling stage 3 so as to be located on a circle CC surrounding the wafer setting center at a predetermined distance. In the embodiment, there is used a two-point driving system in which the point OA among the three points OA, OB, and OC is used as a fixed point and the other two points OB and OC are used as drive points. The drive points OB and OC are driven in the Z direction by an actuator unit 5, respectively, thereby controlling an angle of inclination in an arbitrary direction of the leveling stage 3. In the initial adjustment of the stepper, there is no need to adjust in a manner such that a virtual rotation center point of the leveling stage 3 which is determined by the fixed point OA and drive points OB and OC of the leveling stage 3, that is, by the balance of the rigidities regarding the X and Y directions of the three spring members, is accurately located on the image forming surface IM (surface of the reference wafer). It is sufficient to execute a coarse adjustment to an extent such that a deviation amount $v$ in the Z direction of the rotation center for the image forming surface IM does not exceed a predetermined value (for instance, 100 $\mu$m). Therefore, the adjusting time can be reduced by slightly simplifying the initial adjustment. However, it is necessary to adjust in a manner such that the image forming surface IM accurately coincides with the surface of the reference wafer and such that the parallelism between the upper and lower surfaces is extremely good and the central value of the thickness allowance tolerance is set to the thickness.

With respect to the detectors 6, 7, and 12, for example, as is well known in JP-A-62-150721 or the like, the illumination light is irradiated onto rectangular mirrors (not shown) of the reticle stage RS or the plane mirrors ($6m$, $7m$) of the X - Y stage 1 and onto a fixed mirror (not shown) fixed to a mirror barrel of the projection lens PL, and an interference fringe due to two reflected light fluxes is photoelectrically detected, thereby always detecting the two-dimensional positions of the reticle stage RS and X - Y stage 1 for the fixed portion of the stepper at a resolution of, e.g., 0.02 $\mu$m. As shown in FIG. 2, the center lines of the laser light fluxes which are irradiated from the detectors 6 and 7 are set to measuring axes $LX_1$ and $LY_1$ in the X and Y directions and the detectors 6 and 7 are arranged in a manner such that the measuring axes $LX_1$ and $LY_1$ perpendicularly cross at a point Q and an optical axis AX of the projection lens PL passes through the point Q and the plane including the two measuring axes $LX_1$ and $LY_1$ coincides with the image forming surface IM. That is, the laser interferometers forming the detectors 6 and 7 are arranged so that an Abbe error is set to zero for the exposing position (point Q). In a manner similar to the above, the laser interferometer forming the detector 12 is arranged so that an Abbe error is set to zero for the optical axis AX.

Detectors 8 and 9, which are formed by laser interferometers, are provided on the Z stage 2 in order to detect the lateral deviation amounts in the X and Y directions of the wafer W for the Z stage 2 and X - Y stage 1 which are caused by the inclination of the leveling stage 3. Corner reflectors $8b$ and $9b$ for the detectors 8 and 9 have two reflecting mirrors which are mutually perpendicular as shown in FIG. 1 and are fixed to outer peripheral edge surfaces of leveling stage 3 at two positions of the leveling stage 3 which are located along directions which are mutually perpendicular. Considering detector 8, a parallel laser beam emitted in the X-direction from a laser light source $8a$ impinges on a mirror $8c$ associated with the laser light source $8a$ after reflection from the two reflecting surfaces of the corner reflector $8b$, which is arranged so that its vertex line is in parallel with the upper surface of the X - Y stage 1. Therefore, the laser beam reflected by the corner reflector $8b$ always enters the reflecting mirror $8c$ perpendicular thereto and parallel to its original optical path irrespective of the fine deviation of the corner reflector $8b$ in the Z direction in association with the inclination of the leveling stage 3.

The return laser beam from the reflecting mirror $8c$ and the return laser beam from a fixed mirror (not shown) provided in the laser light source $8a$ are coaxially synthesized. Thus, an interference fringe which flickers depending on the movement in the X direction of the corner reflector $8b$ is formed on the photo sensitive surface of a receiver (not shown) associated with the laser light source $8a$. By photoelectrically detecting a change in such an interference fringe, a lateral deviation amount $\Delta X$ of the wafer W for the X - Y stage 1 is detected. In the embodiment, the rotatable wafer holder ($\theta$ table) has been provided over the leveling stage 3. However, the leveling stage 3 can inserted be provided over the wafer holder However, in this case, since the corner reflector $8b$ rotates integrally with the leveling stage 3 in association with the rotation of the wafer holder ($\theta$ table), the reflected laser beam is deflected in accordance with the rotation and is deviated from the original optical path. Therefore, in place of the two mirror corner reflector $8b$, it is necessary to use a three-mirror corner reflector for instance, what is called a corner cube. In any case, in a manner similar to the detector 8, the other detector 9 comprising a laser light source $9a$, corner reflector $9b$ (like $8b$), and a reflecting mirror $9c$ is also provided for the Z stage 2 in order to detect a lateral deviation amount $\Delta Y$ in the Y direction of the wafer W for the X - Y stage 1.

The detectors 8 and 9 are arranged so that the plane including measuring axes $LX_2$ and $LY_2$ coincides with the plane including the measuring axes $LX_1$ and $LY_1$ of the detectors 6 and 7. Further, the detectors 8 and 9 are arranged so that the measuring axes $LX_2$ and $LY_2$ perpendicularly cross at the point Q such that an Abbe error is set to zero for the exposing position (point Q) and the optical axis AX of the projection lens PL passes through the point Q. Therefore, the laser interferometers of the detectors 6 to 9 are arranged such that the Abbe errors are set to zero for the exposing position and, further, the plane including the two measuring axes ($LX_1$, $LY_1$) and the plane including the two measuring axes ($LX_2$, $LY_2$) accurately coincide with the surface of the reference wafer and the image forming surface IM.

A horizontal position detecting system 11 of the collimator type comprising a light projector $11a$ and four-divided photo sensitive elements $11d$ is shown in FIG. 1. The light projector $11a$ has an illuminating light source (not shown) to generate illumination light of a non-exposure wavelength, a diaphragm with a fine circular opening, a field diaphragm to set the shape of a detecting area (illuminating area) to an arbitrary shape, and the like. The light projector $11a$ emits parallel light flux to the wafer W through a lens $11b$ from an oblique direction to the optical axis AX. The reflected light flux is detected through a lens $11c$ by the 4-divided photo sensitive elements $11d$ serving as a photodetector. A construction and the like of the horizontal position detecting system 11 have been disclosed in, for instance, U.S. Pat. No. 4,558,949 mentioned above. The inclination of an arbitrary shot area on the wafer W, for instance, the inclination of the surface of a chip having a reticle pattern which has already been formed on the wafer W for the image forming surface IM is detected by the horizontal position detecting system 11. In the embodiment, it is assumed that the horizontal position detecting system 11 has previously been calibrated in a manner such that when the chip surface coincides with the image forming surface IM, the light flux from the light projector 11a is converged to the central position of the 4-divided photo sensitive elements 11d. A main controller 10 outputs predetermined drive commands to the actuator units 4, 5, and 13 in accordance with various calculation values and detection signals from the horizontal position detecting system 11 and detectors 6, 7, 8, 9, and 12 and the like and controls the positions of the X - Y stage 1 and reticle stage RS and the inclination of the leveling stage 3. Further, the main controller 10 integrally controls the operation of the whole apparatus including the horizontal position detecting system 11 and the like.

The operation of the apparatus of the embodiment constructed as mentioned above will now be described.

In the embodiment, it is assumed that the enhancement global alignment (EGA) disclosed in, for instance, U.S. Pat. No. 4,780,617 is executed by using a laser step alignment system (LSA) 14 of the TTL (Through The Lens) system in which a spot light (sheet beam) is irradiated to a wafer mark (not shown) through the projection lens PL and the diffracted light or scattered light which is generated from the wafer mark is photoelectrically detected. That is, among the chips formed in a matrix form, the coordinate values of the chip located at the center of the wafer W and of the chips located near the outer periphery of the wafer W are measured and the chip arrangement is obtained from the coordinate values of those chips by the statistic method. By stepping the X - Y stage 1 in accordance with the chip arrangement, the projection image of the reticle pattern and the chip can be accurately overlaid. Since the initial adjustment of the leveling stage 3 is simplified as mentioned above, a deviation amount $\nu$ in the Z direction remains between the rotation center point and the wafer surface.

In FIG. 1, after the projection image of the reticle pattern and the chip are accurately overlaid by the EGA in the LSA 14, the main controller 10 first detects an angle $\Delta\theta$ of inclination of the chip by using the horizontal position detecting system 11. Next, inclination angles $\Delta\theta$ in the X and Y directions of the leveling stage 3 are obtained from the inclination of the chip. That is, the drive amounts in the Z direction of the drive points OB and OC of the leveling stage 3 are calculated. By outputting a drive command corresponding to those drive amounts to the actuator unit 5 for the leveling stage, the leveling stage 3 is inclined through the actuator unit 5 and the chip surface is accurately made coincident with the image forming surface IM. After completion of the leveling, the main controller 10 reads the detection signals from the detectors 8 and 9 and detects the lateral deviation amounts $\Delta X$ and $\Delta Y$ of the chip according to the inclination angle $\Delta\theta$ which is caused by the inclination of the leveling stage 3, in which the deviation amount $\nu$ in the Z direction is a main factor of the lateral deviation. The position of the X - Y stage 1 is controlled by the actuator unit 4 on the basis of the lateral deviation amounts $\Delta X$ and $\Delta Y$ while monitoring the position of the X - Y stage 1 by the detectors 6 and 7, thereby correcting the lateral deviation of the chip. Thus, the chip is accurately set to the exposing position (point Q). After that, by repeating the operations similar to the above for every chip, the lateral deviations in association with the inclination of the leveling stage 3 of all of the chips on the wafer W are easily corrected. Deterioration and the like of the positioning accuracy of the wafer stage can be prevented. The projection image of the reticle pattern and the chip can be overlaid at high accuracy.

The embodiment has been described above with respect to the correction of the relative positional deviation between the projection image of the reticle pattern and the chip due to the lateral deviation of the wafer W which is mainly caused by the deviation amount $\nu$ in the Z direction. However, the leveling apparatus according to the invention is not limited to the correction of such a relative positional deviation. It can also correct the lateral deviation of the wafer W for a predetermined reference point. For instance, even when the alignment, various kinds of measurements, or the like is executed by using the alignment system of the off-axis system, the lateral deviation of the wafer W due to the inclination of the leveling stage 3 for the mark detecting position (reference point) of the alignment system can be also easily corrected.

As shown in FIG. 1, if the apparatus is constructed in a manner such that the position of the reticle stage RS is controlled through the actuator unit 13 on the basis of the lateral deviation amounts $\Delta X$ and $\Delta Y$ and a projection magnification of the projection lens PL while monitoring them by the detector 12, the position of the reticle stage RS, having weight lighter than that of the X - Y stage 1, is controlled so that the relative positional deviation between the projection image of the reticle pattern and the chip can be further easily corrected. The exposure operating speed of the stepper can be made higher by using a sequence such that with respect to only the chips in which the lateral deviation amounts $\Delta X$ and $\Delta Y$ which are detected by the detectors 8 and 9 exceed a predetermined value, for instance, the resolution (0.02 $\mu$m) of the laser interferometers 6 and 7, the position of the X - Y stage 1 or reticle stage RS is controlled in accordance with the lateral deviation amounts $\Delta X$ and $\Delta Y$ and the lateral deviations of those chips are corrected without correcting the lateral deviation of each chip.

As mentioned above, in the embodiment, the leveling stage 3 is adjusted so that the plane including the measuring axes $LX_2$ and $LY_2$ of the detectors 8 and 9 coincides with the surface of the reference wafer or the like. Further, the lateral deviation amounts $\Delta X$ and $\Delta Y$ which are caused by the deviation amount $\nu$ in the Z direction between the rotation center point of the leveling stage 3 and the surface of the wafer W, accurately speaking, the surface of the reference wafer, are detected by using the detectors 8 and 9. However, actually, thicknesses of the wafer W and wafer holder, that is, a thickness of the portion higher than the leveling stage 3 fluctuates due to an increase in fluctuation of the thickness of the wafer W caused by a manufacturing tolerance, a manufacturing error, or the like, so that a deviation amount (hereinafter, referred to as a "thickness variation t") in the Z direction can be further caused between the surface of the reference wafer and the wafer W (namely, chip).

Therefore, when the surface of the reference wafer and the image forming surface IM were made coincident, the height position (initial position) of the Z stage 2 has been previously stored in the main controller 10 upon initial adjustment. When the focus matching of the chip is executed by focus detecting means of the oblique incident system as disclosed in, for instance, U.S. Pat. No. 4,650,983, a deviation amount of the wafer surface for the initial position of the Z stage 2, namely, the thickness variation t of the wafer is detected by using a potentiometer (not shown) or the like provided for the Z stage 2. In addition to the lateral deviation amounts $\Delta X$ and $\Delta Y$ which are caused by the deviation amount $\nu$ in the Z direction which are detected by the detectors 8 and 9, the main controller 10 determines the lateral deviation amount ($t \sin \Delta\theta$) which is caused by the thickness variation t on the basis of the thickness variation t and the inclination angle $\Delta\theta$ of the leveling stage 3. Next, if the position of the X - Y stage 1 or reticle stage RS is controlled by adding or subtracting the lateral deviation amount obtained as a result of this determination to or from the lateral deviation amounts $\Delta X$ and $\Delta Y$, the lateral deviation amount due to the thickness variation t can be also corrected. The lateral deviation can thus be corrected at a higher accuracy. If the deviation amount $\nu$ in the Z direction between the rotation center of the leveling stage 3 and the surface of the reference wafer has previously been obtained, the total lateral deviation amount of the chips can be presumed from the deviation amount $\nu$, thickness variation t, and inclination angle $\Delta\theta$ of the leveling stage 3.

In the embodiment, since the lateral deviation which is caused due to a distance $\delta$ between the rotation center point of the leveling stage 3 and the chip center, namely, what is called a cosine error $\Delta Ce [\Delta Ce = \delta \cdot (1 - \cos\theta)]$ is very small (about $1/1000$ $\mu m$), cosine error may be considered inconsequential. However, the cosine error can be also easily corrected by a method whereby the lateral deviation amount of the chip is determined on the basis of the arrangement map of the wafer W which has previously been input or the chip arrangement which is obtained by the EGA, that is, on the basis of the distance $\delta$ between the rotation center point of the leveling stage 3 and the chip center which is obtained by the position information and the inclination angle $\Delta\theta$ of the leveling stage 3, and the position of the X - Y stage 1 or reticle stage RS is similarly controlled on the basis of the value obtained as a result of this determination and the lateral deviation amounts $\Delta X$ and $\Delta Y$.

As mentioned above, according to the embodiment of the invention, the position of the X - Y stage 1 or reticle stage RS has been controlled in accordance with the lateral deviation amounts $\Delta X$ and $\Delta Y$ of the chip in association with the inclination of the leveling stage 3 and the lateral deviation of the chip has been corrected. However, the correcting method of the lateral deviation according to the invention is not limited to only the above method. For instance, the lateral deviation of the chip can be also corrected by a method using a projection optical system in which the positions of at least parts of the lens elements among a plurality of lens elements are variable. For example, a projection optical system which comprises a projection lens main body and a field lens which is arranged between the projection lens and the reticle R and whose optical characteristics are equal to the projection lens PL may be used in place of the foregoing projection lens PL and the lateral deviation of the chip may be corrected by moving the position of the field lens in accordance with the lateral deviation amounts $\Delta X$ and $\Delta Y$. Thus a change (image shift) of the optical axis due to the movement of the field lens in a direction perpendicular to the optical axis is used. The lateral deviation of the chip can be also corrected by a method whereby a parallel plane glass is arranged between the reticle R and the projection lens PL so as to cross the optical axis AX perpendicularly and the inclination angle of the parallel plane glass is changed in accordance with the lateral deviation amounts $\Delta X$ and $\Delta Y$.

In the above embodiment, what is called individual leveling in which the leveling is executed for every shot has been described. However, effects similar to the above can be also obtained by, for instance, what is called a global leveling, in which the inclinations of a plurality of chips located at the center of the wafer W and around the outer periphery of the wafer W are detected and the leveling stage 3 is inclined only once before exposure on the basis of the average inclination angle of the whole surface of the wafer obtained by weighting the inclinations at the chip positions, or by what is called block leveling, in which a plurality of chips formed on the wafer W in a matrix form are divided into a few blocks and the leveling stage 3 is inclined only once before exposure in each block on the basis of the average inclination angle in the block which is obtained by an operation similar to the above for every block, or the like.

Further, in the above embodiment, a two-point drive system has been used for leveling. However, the similar effects can be also obtained by using a three-point drive system in which all of the operating points OA, OB, and OC are used as drive points. According to the three-point drive system, as compared with the two-point drive system, the drive amounts at three drive points in the Z direction, that is, the elastic deformation amounts of the leaf springs which are used in the leveling stage 3, can be reduced and the absolute amounts of the elastic deformations of the leaf springs are reduced. Thus, it is advantageous in terms of the control of the inclination of the leveling stage 3 and its control time can be also reduced. Further, according to the 3-point drive system, the wafer surface can be moved in parallel in the Z direction by moving the operating points OA, OB, and OC in the Z direction by the same amount. There is no need to additionally provide the Z stage 2 for movement in the Z direction. Even in the case of using such a common-use type stage, the similar effects can be also derived by using the detectors 8 and 9.

In place of providing the reflecting mirrors 8c and 9c for the detectors 8 and 9 integrally with the laser light sources 8a and 9a, for instance, it is also possible to construct the apparatus in a manner such that parts of the back surfaces of the plane mirrors 6m and 7m for the detectors 6 and 7, that is, parts of the surfaces on the side opposite to the reflecting surfaces of the laser beams $LX_1$ and $LY_1$ are accurately finished and the resultant finished surfaces are used in place of the reflecting mirrors 8c and 9c. With such a construction, when the plane mirrors 6m and 7m finely move during the stepping and their positions are deviated, even if the X - Y stage 1 is positioned at a position which is deviated from a predetermined position by the detectors 6 and 7, by controlling the position of the X - Y stage 1, reticle stage RS, or the like by using the lateral deviation amounts (that is, the positional deviation amount of the X - Y stage 1) which are detected by the detectors 8 and 9 at that time, the positional error of the X - Y stage 1 due to the deviation of the positions of the plane mirrors 6m and 7m can be easily corrected.

Since the leveling stage 3 hardly finely rotates in the X - Y plane, there is no need to arrange the detectors 8 and 9, particularly, so as to set the Abbe error to zero. It is sufficient to arrange the detectors 8 and 9 in accordance with the space on the Z stage 2 or the like so that the lateral deviation amounts in the X and Y directions can be detected. Further, the deviation detectors are not limited to laser inteferometers but can be also realized by a different apparatus which can detect the lateral deviation amounts in the X and Y directions of the wafer W for the X - Y stage 1, for instance, by optical or electrostatic type gap sensors or the like. Although the embodiment has been described with respect to the projection type exposing apparatus (stepper), similar effects can be also obtained by an exposing apparatus of the proximity type, an X-ray exposing apparatus, or the like.

What is claimed is:

1. An exposing apparatus for copy transferring a pattern formed on a mask onto a substrate, comprising:
    a moving stage which is two-dimensionally movable in a predetermined exposure reference plane surface;
    inclination detecting means for detecting the inclination of the surface of the substrate in relation to said exposure reference plane surface;
    stage position detecting means for detecting the two-dimensional positions of the moving stage;
    a leveling stage which is mounted over the moving stage and supports the substrate and can incline the substrate in an arbitrary direction in relation to the exposure reference plane surface in cooperation with the inclination detecting means so that the surface of the substrate substantially coincides with the exposure reference plane surface;
    deviation detecting means for detecting two-dimensional deviation amounts of the substrate in relation to the moving stage which are caused in association with the inclination of the leveling stage; and
    control means for controlling the positions of the moving stage which are detected by the stage position detecting means in accordance with the deviation amounts which are detected by the deviation detecting means, thereby correcting the relative positional relation between the mask and the substrate.

2. An apparatus according to claim 1, wherein said control means includes means for comparing the deviation amounts which are detected by the deviation detecting means with a predetermined reference value, and when the deviation amounts exceed the predetermined reference value, the control means controls the position of the moving stage in accordance with the deviation amounts.

3. An apparatus according to claim 1, wherein said deviation detecting means includes two sets of laser light wave interference length measuring instruments each including:
    a reflection optical system which is fixed to the leveling stage and has a plurality of mutually perpendicular reflecting surfaces;
    a laser light source which is provided over the moving stage so as to face the reflection optical system and emits a laser beam toward the reflection optical system; and
    a fixed mirror which is fixed on the moving stage so as to face the reflection optical system in order to receive light flux from the laser light source which is reflected by the reflection optical system, said reflection optical system, laser light source, and fixed mirror being disposed so that light flux from said laser light source is reversely reflected by the reflecting surfaces of said reflection optical system to said fixed mirror along a direction opposite to the direction in which said laser beam is emitted toward said reflection optical system.

4. An apparatus according to claim 1, wherein said control means includes means for determining a deviation amount of the substrate from an output of the inclination detecting means and controls the position of the moving stage on the basis of the deviation amounts which are detected by the deviation detecting means and the deviation amount determined by the determining means.

5. An apparatus according to claim 4, wherein said determining means determines the deviation amount of the substrate on the basis of a fluctuation in thickness of the substrate and the inclination of the surface of the substrate which is detected by the inclination detecting means.

6. An exposing apparatus for copy transferring a pattern formed on a mask onto a substrate, comprising:
    mask holding means which holds the mask and can two-dimensionally move in a substantially horizontal plane;
    mask position detecting means for detecting two-dimensional positions of the mask holding means;
    a moving stage which can two-dimensionally move in a predetermined exposure reference plane surface;
    inclination detecting means for detecting the inclination of the surface of the substrate in relation to the exposure reference plane surface;
    position detecting means for detecting the two-dimensional positions of the moving stage;
    a leveling stage which is mounted over the moving stage and supports the substrate and can incline the substrate in an arbitrary direction in relation to the exposure reference plane surface in cooperation with the inclination detecting means so that the surface of the substrate substantially coincides with the exposure reference plane surface;
    deviation detecting means for detecting two-dimensional deviation amounts of the substrate in relation to the moving stage which are caused in association with the inclination of the leveling stage; and
    control means for controlling the position of the mask holding means which is detected by the mask position detecting means in accordance with the deviation amounts which are detected by the deviation detecting means, thereby correcting the relative positional relation between the mask and the substrate.

7. An apparatus according to claim 6, wherein said control means includes means for comparing the deviation amounts which are detected by the deviation detecting means with a predetermined reference value, and when the deviation amounts exceed the predetermined reference value, the control means controls the position of the mask holding means in accordance with the deviation amounts.

8. An apparatus according to claim 6, wherein said deviation detecting means includes two sets of laser light wave interference length measuring instruments each including:

a reflection optical system which is fixed to the leveling stage and has a plurality of reflecting surfaces which are mutually perpendicular;

a laser light source which is provided on the moving stage so as to face the reflection optical system and emits a laser beam toward the reflection optical system; and a fixed mirror which is fixed on the moving stage so as to face the reflection optical system in order to receive light flux from the laser light source which is reflected by the reflection optical system, said reflection optical system, laser light source, and fixed mirror being disposed so that light flux from said laser light source is reversely reflected by the reflecting surfaces of said reflection optical system to said fixed mirror along a direction opposite to the direction in which said laser beam is emitted toward said reflection optical system.

9. An apparatus according to claim 6, wherein said control means includes means for determining a deviation amount of the substrate from an output of the inclination detecting means and controls the position of the mask holding means on the basis of the deviation amounts which are detected by the deviation detecting means and the deviation amount determined by the determining means.

10. An apparatus according to claim 9, wherein said determining means determines the deviation amount of the substrate on the basis of a fluctuation in thickness of the substrate, and the inclination of the surface of the substrate which is detected by the inclination detecting means.

11. A stage apparatus for supporting a substrate, comprising:

a moving stage which can two-dimensionally move in a predetermined reference plane surface;

inclination detecting means for detecting the inclination of the surface of the substrate in relation to the predetermined reference plane surface;

stage position detecting means for detecting two-dimensional positions of the moving stage;

a leveling stage which is mounted over the moving stage and supports the substrate and can incline the substrate in an arbitrary direction in relation to the reference plane surface in cooperation with the inclination detecting means so that the surface of the substrate substantially coincides with the reference plane surface;

deviation detecting means for detecting two-dimensional deviation amounts of the substrate in relation to the moving stage which are caused in association with the inclination of the leveling stage; and control means for controlling the position of the moving stage which is detected by the stage position detecting means in accordance with the deviation amounts which are detected by the deviation detecting means, thereby correcting the relative positional relation between the mask and the substrate.

12. An apparatus according to claim 11, wherein said control means includes means for comparing the deviation amounts which are detected by the deviation detecting means with a predetermined reference value, and when the deviation amounts exceed the predetermined reference value, the control means controls the position of the moving stage in accordance with the deviation amounts.

13. An apparatus according to claim 11, wherein said deviation detecting means includes two sets of laser light wave interference length measuring instruments each including:

a reflection optical system which is fixed to the leveling stage and has a plurality of reflecting surfaces which are mutually perpendicular;

a laser light source which is provided over the moving stage so as to face the reflection optical system and emits a laser beam toward the reflection optical system; and a fixed mirror which is fixed onto the moving stage so as to face the reflection optical system in order to receive light flux from the laser light source which is reflected by the reflection optical system, said reflection optical system, laser light source, and fixed mirror being disposed so that light flux from said laser light source is reversely reflected by the reflecting surfaces of said reflection optical system to said fixed mirror along a direction opposite to the direction in which said laser beam is emitted toward said reflection optical system.

14. An apparatus according to claim 11, wherein said control means includes means for determining a deviation amount of the substrate from an output of the inclination detecting means and controls the position of the moving stage on the basis of the deviation amounts which are detected by the deviation detecting means and the deviation amount determined by the determining means.

15. An apparatus according to claim 14, wherein said determining means determines the deviation amount of the substrate on the basis of a fluctuation in thickness of the substrate and the inclination of the surface of the substrate which is detected by the inclination detecting means.

* * * * *